US008942030B2

(12) United States Patent
Liaw

(10) Patent No.: US 8,942,030 B2
(45) Date of Patent: Jan. 27, 2015

(54) STRUCTURE AND METHOD FOR SRAM CELL CIRCUIT

(75) Inventor: Jhon Jhy Liaw, Zhudong Township, Hsinchu County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 387 days.

(21) Appl. No.: 12/823,860

(22) Filed: Jun. 25, 2010

(65) Prior Publication Data

US 2011/0317485 A1 Dec. 29, 2011

(51) Int. Cl.
*G11C 11/00* (2006.01)
*H01L 27/11* (2006.01)
*G11C 8/16* (2006.01)
*G11C 11/412* (2006.01)

(52) U.S. Cl.
CPC .................. *H01L 27/11* (2013.01); *G11C 8/16* (2013.01); *H01L 27/1104* (2013.01); *G11C 11/412* (2013.01)
USPC ...................................... 365/154; 365/230.05

(58) Field of Classification Search
USPC ...................................... 365/154, 156, 203.06
See application file for complete search history.

(56) References Cited

U.S. PATENT DOCUMENTS

| | | | |
|---|---|---|---|
| 5,289,432 A | 2/1994 | Dhong et al. | |
| 5,703,392 A * | 12/1997 | Guo | 257/392 |
| 5,837,573 A * | 11/1998 | Guo | 438/238 |
| 6,072,715 A * | 6/2000 | Holloway | 365/156 |
| 6,084,820 A | 7/2000 | Raszka | |
| 6,091,626 A | 7/2000 | Madan | |
| 6,181,634 B1 | 1/2001 | Okita | |
| 6,528,897 B2 * | 3/2003 | Kuwazawa | 365/154 |
| 6,535,453 B2 * | 3/2003 | Nii et al. | 365/230.05 |
| 6,706,571 B1 | 3/2004 | Yu et al. | |
| 6,858,478 B2 | 2/2005 | Chau et al. | |
| 6,909,135 B2 * | 6/2005 | Nii et al. | 257/297 |
| 6,934,182 B2 * | 8/2005 | Chan et al. | 365/154 |
| 7,002,258 B2 | 2/2006 | Mali et al. | |
| 7,056,781 B2 | 6/2006 | Yoon et al. | |
| 7,190,050 B2 | 3/2007 | King et al. | |
| 7,247,887 B2 | 7/2007 | King et al. | |
| 7,265,008 B2 | 9/2007 | King et al. | |
| 7,269,056 B1 * | 9/2007 | Liaw | 365/154 |
| 7,440,356 B2 * | 10/2008 | Venkatraman et al. | 365/230.05 |
| 7,508,031 B2 | 3/2009 | Liu et al. | |

(Continued)

OTHER PUBLICATIONS

Bartlomiej Jan Pawlak, et al., U.S. Appl. No. 12/569,689, "Method of Fabricating Finfet Device," filed Sep. 29, 2009, 21 pages.
Hsien-Hsin Lin, et al., U.S. Appl. No. 12/703,918, "Method for Fabricating a Finfet Device," filed Feb. 11, 2010, 40 pages.
Chien-Chang Su, et al., U.S. Appl. No. 12/644,869, "Method for Incorporating Impurity Element in EPI Silicon Process," filed Dec. 22, 2009, 21 pages.

(Continued)

*Primary Examiner* — Kretelia Graham
(74) *Attorney, Agent, or Firm* — Haynes and Boone, LLP

(57) ABSTRACT

The present disclosure provides a static random access memory (SRAM) cell. The SRAM cell includes a first and a second pull-up devices; a first and a second pull-down devices configured with the first and second pull-up devices to form two cross-coupled inverters for data storage; and a first and second pass-gate devices configured with the two cross-coupled inverters to form a port for data access, wherein the first and second pull-down devices each includes a first channel doping feature of a first doping concentration, and the first and second pass-gate devices each includes a second channel doping feature of a second doping concentration greater than the first doping concentration.

14 Claims, 11 Drawing Sheets

(56) References Cited

U.S. PATENT DOCUMENTS

| | | | |
|---|---|---|---|
| 7,528,465 B2 | 5/2009 | King et al. | |
| 7,605,449 B2 | 10/2009 | Liu et al. | |
| 7,629,643 B2 * | 12/2009 | Pillarisetty et al. | 257/327 |
| 7,684,274 B2 * | 3/2010 | Rengarajan et al. | 365/207 |
| 7,737,501 B2 * | 6/2010 | Zhu et al. | 257/365 |
| 7,738,282 B2 | 6/2010 | Liaw et al. | |
| 7,807,523 B2 | 10/2010 | Liu et al. | |
| 7,862,962 B2 | 1/2011 | Shieh et al. | |
| 7,898,037 B2 | 3/2011 | Chuang et al. | |
| 7,910,453 B2 | 3/2011 | Xu et al. | |
| 7,939,862 B2 | 5/2011 | Moroz et al. | |
| 7,943,986 B2 | 5/2011 | Yang et al. | |
| 7,960,232 B2 | 6/2011 | King et al. | |
| 7,989,355 B2 | 8/2011 | Shieh et al. | |
| 8,053,299 B2 | 11/2011 | Xu | |
| 8,062,963 B1 | 11/2011 | van Dal | |
| 8,153,493 B2 | 4/2012 | Lee | |
| 8,212,295 B2 | 7/2012 | Liaw | |
| 8,278,173 B2 | 10/2012 | Lim et al. | |
| 8,283,231 B2 | 10/2012 | Merelle et al. | |
| 8,310,013 B2 | 11/2012 | Lin et al. | |
| 8,338,251 B2 * | 12/2012 | Berthold et al. | 438/257 |
| 8,338,305 B2 | 12/2012 | Chen et al. | |
| 8,675,397 B2 * | 3/2014 | Liaw | 365/154 |
| 2005/0153490 A1 | 7/2005 | Yoon et al. | |
| 2005/0247981 A1 | 11/2005 | Wang | |
| 2005/0253287 A1 | 11/2005 | Liaw | |
| 2007/0025132 A1 | 2/2007 | Liaw | |
| 2007/0034923 A1 * | 2/2007 | Liaw | 257/296 |
| 2007/0090428 A1 | 4/2007 | Liaw | |
| 2007/0120156 A1 | 5/2007 | Liu et al. | |
| 2007/0122953 A1 | 5/2007 | Liu et al. | |
| 2007/0122954 A1 | 5/2007 | Liu et al. | |
| 2007/0128782 A1 | 6/2007 | Liu et al. | |
| 2007/0132053 A1 | 6/2007 | King et al. | |
| 2007/0228372 A1 | 10/2007 | Yang et al. | |
| 2008/0019171 A1 * | 1/2008 | Liaw | 365/174 |
| 2008/0123462 A1 * | 5/2008 | Liaw | 365/230.05 |
| 2008/0197419 A1 * | 8/2008 | Liaw | 257/368 |
| 2008/0258228 A1 | 10/2008 | Chuang et al. | |
| 2008/0263492 A1 | 10/2008 | Chuang et al. | |
| 2008/0290470 A1 | 11/2008 | King et al. | |
| 2008/0296632 A1 | 12/2008 | Moroz et al. | |
| 2009/0035909 A1 | 2/2009 | Chang et al. | |
| 2009/0181477 A1 | 7/2009 | King et al. | |
| 2009/0189227 A1 * | 7/2009 | Miyashita | 257/393 |
| 2010/0006945 A1 | 1/2010 | Merelle et al. | |
| 2010/0006974 A1 | 1/2010 | Xu et al. | |
| 2010/0052059 A1 | 3/2010 | Lee | |
| 2010/0183961 A1 | 7/2010 | Shieh et al. | |
| 2010/0203734 A1 | 8/2010 | Shieh et al. | |
| 2010/0264468 A1 | 10/2010 | Xu | |
| 2011/0073919 A1 | 3/2011 | Pawlak | |
| 2011/0101421 A1 | 5/2011 | Xu | |
| 2011/0117679 A1 | 5/2011 | Lee et al. | |
| 2011/0147846 A1 | 6/2011 | Su et al. | |
| 2011/0248348 A1 | 10/2011 | Gan et al. | |
| 2011/0278676 A1 | 11/2011 | Cheng et al. | |
| 2011/0282478 A1 | 11/2011 | Shen et al. | |
| 2011/0283245 A1 | 11/2011 | Shen et al. | |
| 2011/0317477 A1 | 12/2011 | Liaw | |
| 2012/0001197 A1 | 1/2012 | Liaw et al. | |
| 2012/0009690 A1 | 1/2012 | Wann et al. | |
| 2012/0012932 A1 | 1/2012 | Perng et al. | |
| 2012/0018848 A1 | 1/2012 | Huang et al. | |
| 2012/0049282 A1 | 3/2012 | Chen et al. | |
| 2012/0091528 A1 | 4/2012 | Chang et al. | |
| 2012/0104472 A1 | 5/2012 | Xu et al. | |
| 2012/0126325 A1 | 5/2012 | Wang et al. | |
| 2012/0126326 A1 | 5/2012 | Wang et al. | |
| 2012/0126375 A1 | 5/2012 | Wang et al. | |

OTHER PUBLICATIONS

Tsung-Lin Lee, et al., U.S. Appl. No. 12/622,038, "Sacrificial Offset Protection Film for a Finfet Device," filed Nov. 19, 2009, 56 pages.

Jeff J. Xu, et al., U.S. Appl. No. 12/784,207, "Method of Forming EPI Film in Substrate Trench," filed May 20, 2010, 33 pages.

Ming-Lung Cheng, et al. U.S. Appl. No. 12/780,124, "Method and Apparatus for Enhancing Channel Strain," filed May 14, 2010, 35 pages.

Jhon Jhy Liaw, U.S. Appl. No. 12/823,907, "Cell Structure for Dual-Port SRAM," filed Jun. 25, 2010, 46 pages.

Jhon Jhy Liaw, U.S. Appl. No. 12/827,406, "Rom Cell Circuit for Finfet Devices," filed Jun. 30, 2010, 32 pages.

Jhon Jhy Liaw, et al., U.S. Appl. No. 12/827,690, "Layout for Multiple-Fin SRAM Cell," filed Jun. 30, 2010, 35 pages.

Jeng-Jung Shen, et al., U.S. Appl. No. 12/780,060, "Automatic Layout Conversion for Finfet Device," filed May 14, 2010, 29 pages.

Jeng-Jung Shen, et al., U.S. Appl. No. 12/780,426, "Finfet Boundary Optimization," filed May 14, 2010, 28 pages.

Yu-Lien Huang, et al., U.S. Appl. No. 12/840,830, "High Surface Dopant Concentration Semiconductor Device and Method of Fabricating," filed Jul. 21, 2010, 21 pages.

Peng-Soon Lim, et al., U.S. Appl. No. 12/827,512, "Gate Structures and Method of Fabricating Same," filed Jun. 30, 2010, 41 pages.

Tsu-Hsiu Perng, et al., U.S. Appl. No. 12/837,093, "Fin-Like Field Effect Transistor (Finfet) Device and Method of Manufacturing Same," filed Jul. 15, 2010, 30 pages.

Clement Hsingjen Wann, et al., U.S. Appl. No. 12/834,617, "In-Situ Spectrometry," filed Jul. 12, 2010, 20 pages.

Chia-Chung Chen, et al., U.S. Appl. No. 12/871,476, "Gate Controlled Bipolar Junction Transistor on Fin-Like Field Effect Transistor (Finfet) Structure," filed Aug. 30, 2010, 30 pages.

Jeff J. Xu, et al, U.S. Appl. No. 12/906,820, "Fin-Like Field Effect Transistor (Finfet) Device and Method of Manufacturing Same," filed Oct. 18, 2010, 55 pages.

Jeff J. Csu, et al, U.S. Appl. No. 12/917,902, "Fin-Like Field Effect Transistor (FINFET) Device and Method of Manufacturing Same," filed Nov. 2, 2010, 61 pages.

Mark van Dal, U.S. Appl. No. 12/900,895, "Method of Fabricating a Semiconductor Device Having an Epitaxly Region," filed Oct. 8, 2010, 21 pages.

Hsin-Chih Chen, et al, U.S. Appl. No. 12/907,272, "Multi-Fin Device by Self-Aligned Castle Fin Formation," filed Oct. 19, 2010, 34 pages.

Chien-Hsun Wang, et al, U.S. Appl. No. 12/952,376, "Method for Adjusting Fin Width in Integrated Circuitry," filed Nov. 23, 2010, 27 pages.

Chien-Shun Wang, et al, U.S. Appl. No. 12/949,881, "Method for Forming Metrology Structures From Fins in Integrated Circuitry," filed Nov. 19, 2010, 16 pages.

Chien-Hsun Wang, et al, U.S. Appl. No. 12/953,148, "Device and Method for Forming Fins in Integrated Circuitry," filed Nov. 23, 2010, 39 pages.

Koji Nii et al., "27.9—A 90nm Dual-Port SRAM with 2.04μm² 8T-Thin Cell Using Dynamically-Controlled Column Bias Scheme" ISSCC 2004 / Session 27 / SRAM / 27.9, 2004 IEEE International Solid-State Circuits Conference, 0-7803-8267-6/04, 2004 IEEE, 10 pages.

Application for related matter U.S. Appl. No. 12/823,907, filed Jun. 25, 2010, 46 pages.

Application for related matter U.S. Appl. No. 12/827,406, filed Jun. 30, 2010, 32 pages.

Application for related matter U.S. Appl. No. 12/827,690, filed Jun. 30, 2010, 36 pages.

Application for related matter U.S. Appl. No. 12/721,476, filed Mar. 10, 2010, 37 pages.

* cited by examiner

US 8,942,030 B2

STRUCTURE AND METHOD FOR SRAM CELL CIRCUIT

CROSS REFERENCE

The present disclosure is related to the following commonly-assigned U.S. patent applications, the entire disclosures of which are incorporated herein by reference: U.S. Ser. No. 12/721,476 filed Mar. 10, 2010 by the same inventor Jhon Jhy Liaw for "FULLY BALANCED DUAL-PORT MEMORY CELL"; U.S. Ser. No. 12/823,907 filed Jun. 25, 2010 "CELL STRUCTURE FOR DUAL-PORT SRAM", U.S. Ser. No. 12/827,406 filed Jun. 30, 2010 "ROM CELL CIRCUIT FOR FINFET DEVICES" and U.S. Ser. No. 12/827,690 filed Jun. 30, 2010 "LAYOUT FOR MULTIPLE-FIN SRAM CELL" for by the same inventor Jhon Jhy Liaw.

BACKGROUND

In deep sub-micron integrated circuit technology, an embedded static random access memory (SRAM) device has become a popular storage unit of high speed communication, image processing and system-on-chip (SOC) products. For example, a fin transistor, such as a fin field-effect transistor (FinFET), is introduced to replace a planar transistor and is used to form a SRAM device. The fin transistor has a channel (referred to as a fin channel) associated with a top surface and opposite sidewalls. The fin channel has a total channel width defined by the top surface and the opposite sidewalls. In advanced technology nodes, such as 32 nm or beyond, a FinFET is advantageous to the planar transistor because of its lower leakage.

In a SRAM cell, such as a SRAM cell with 6 transistors (6T-SRAM), the layout with the beta ratio close to 1 provides a reduced cell size. In this situation, the pull-down devices and the pass-gate devices have a same device dimension. In a SRAM cell using FinFETs, a single fin size for all transistors can provide the minimized cell size. As to a high speed application, equal numbers of pull-down devices and of pass-gate devices provide a proper tradeoff between the cell speed and the cell size. In this situation, the beta ratio is equal to or less than one. However, this will lead to various beta ratio associated issues such as current crowding. Therefore, it is desired to have a new structure and a method to address the above issues.

SUMMARY

The present disclosure provides a static random access memory (SRAM) cell. The SRAM cell includes a first and a second pull-up devices; a first and a second pull-down devices configured with the first and second pull-up devices to form two cross-coupled inverters for data storage; and first and second pass-gate devices configured with the two cross-coupled inverters to form a port for data access, wherein the first and second pull-down devices each includes a first channel doping feature of a first doping concentration, and the first and second pass-gate devices each includes a second channel doping feature of a second doping concentration greater than the first doping concentration.

The present disclosure also provides another embodiment of a SRAM cell. The SRAM cell includes a first inverter including a first pull-up transistor (PU-1) and a first pull-down transistor (PD-1); a second inverter including a second pull-up transistor (PU-2) and a second pull-down transistor (PD-2), the second inverter being cross-coupled with the first inverter for data storage; and a port including a first pass-gate transistor (PG-1) and a second pass-gate transistor (PG-2), the port being coupled with the first and second inverters for data access, wherein each of PD-1, PD-2, PG-1 and PG-2 includes a n-type fin field-effect transistor (nFinFET) and each of PU-1 and PU-2 includes a p-type fin field-effect transistor (pFinFET), PD-1 and PD-2 are designed to have a first threshold voltage, and PG-1 and PG-2 are designed to have a second threshold voltage greater than the first threshold voltage.

The present disclosure also provides a method including forming a pair of p-type fin field-effect transistors (pFinFETs) on a semiconductor substrate; forming a first pair of n-type fin field-effect transistors (nFinFETs) on the semiconductor substrate and having a first threshold voltage, the first pair of nFinFETs and the pair of pFinFETs being configured as two cross-coupled inverters for data storage; and forming a second pair of nFinFETs on the semiconductor substrate and having a second threshold voltage greater than the first threshold voltage, the second pair nFinFETs being configured with the two cross-coupled inverters for data access, wherein the forming of the second pair of nFinFETs includes performing an additional threshold voltage (Vt) tuning implantation to the second pair of nFinFETs while the first pair of nFinFETs are covered from the additional Vt tuning implantation.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
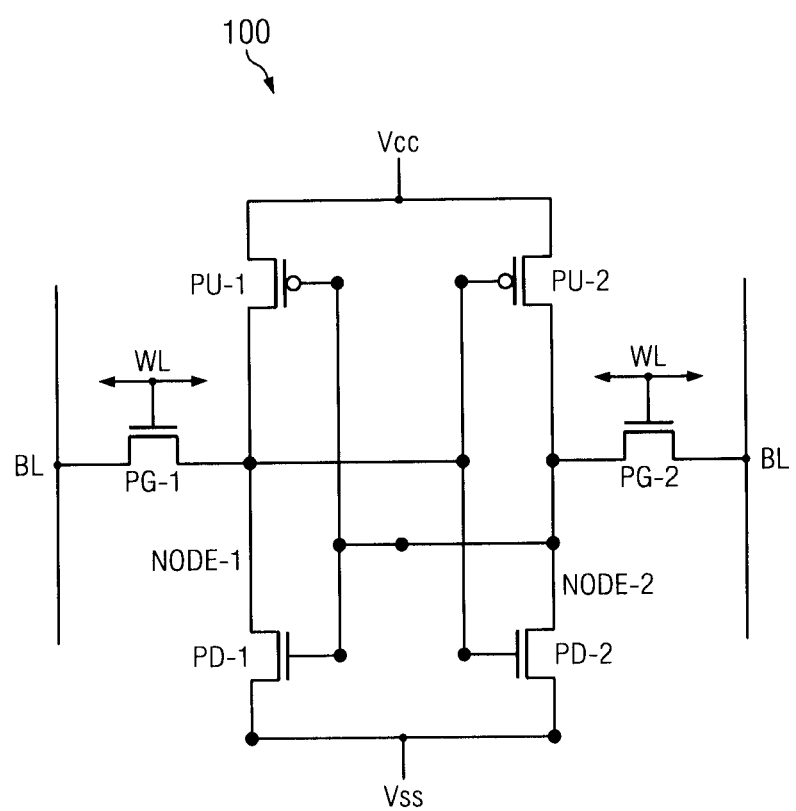
FIG. 1 is a schematic view of a static random access memory (SRAM) device constructed according to various aspects of the present disclosure in one embodiment.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a schematic view of a SRAM cell 100 constructed according to various aspects of the present disclosure in one embodiment. The SRAM cell 100 includes fin field-effect transistors (FinFETs). The SRAM cell 100 includes a first and second inverters that are cross-coupled as a data storage. The first inverter includes a first pull-up device formed with a p-type fin field-effect transistor (pFinFET), referred to as PU-1. The first inverter includes a first pull-down device formed with an n-type fin field-effect transistor (nFinFET), referred to as PD-1. The drains of the PU-1 and PD-1 are electrically connected together, forming a first data node ("Node 1"). The gates of PU-1 and PD-1 are electrically connected together. The source of PU-1 is electrically connected to a power line Vcc. The source of PD-1 is electrically connected to a complimentary power line Vss. The second inverter includes a second pull-up device formed with a pFinFET, referred to as PU-2. The second inverter also includes a second pull-down device formed with an nFinFET, referred to as PD-2. The drains of the PU-2 and PD-2 are electrically connected together, forming a second data node ("Node-2). The gates of PU-2 and PD-2 are electrically connected together. The source of PU-2 is electrically connected to the power line Vcc. The source of PD-2 is electrically connected to the complimentary power line Vss. Furthermore, the first data node is electrically connected to the gates of PU-2 and PD-2, and the second data node is electrically connected to the gates of PU-1 and PD-1. Therefore, the first and second inverters are cross-coupled as illustrated in FIG. 1.

The SRAM cell 100 further includes a first pass-gate device formed with an n-type fin field-effect transistor (nFinFET), referred to as PG-1, and a second pass-gate device formed with an n-type fin field-effect transistor (nFinFET), referred to as PG-2. The source of the first pass-gate PG-1 is electrically connected to the first data node and the source of the first pass-gate PG-2 is electrically connected to the second data node, forming a port for data access. Furthermore, the drain of PG-1 is electrically connected to a bit line ("BL"), and the gate of PG-1 is electrically connected to a word line ("WL"). Similarly, the drain of PG-2 is electrically connected to a bit line bar or the bit line BL, and the gate of PG-2 is electrically connected to the word line WL.

In one embodiment, the various nFinFETs and pFinFETs are formed using high-k metal gate technology so the gate stacks includes a high-k dielectric material layer for gate dielectric and one or more metals for gate electrode. The cell 100 may include additional devices such as additional pull-down devices and pass-gate devices. In one example, each of the first and second inverters includes one or more pull-down devices configured in parallel. In yet another example, the cell 100 include an additional port having two or more pass-gate devices for additional data access, such as data reading or writing.

FIGS. 2 to 6 are top views of a SRAM cell 110 constructed according to various aspects of the present disclosure in one embodiment. The SRAM cell 110 and a method of making the same are collectively described with reference to FIGS. 2 through 6. In one embodiment, the SRAM cell 110 is a portion of the SRAM cell 100 of FIG. 1 in a particular configuration. The SRAM cell 110 is formed on a semiconductor substrate and include various FinFETs.

The SRAM cell 110 is formed in a unit cell region 112 of the semiconductor substrate. The unit cell region 112 is defined by the unit cell boundary 114. In one embodiment, the unit cell region 112 is defined in a rectangular shape spanning to a first dimension 116 in a first direction and spanning to a second dimension 118 in a second direction perpendicular to the first direction. The first dimension 116 is longer than the second dimension 118. So the first and second dimensions (116 and 118) are referred to as a longer pitch and a shorter pitch, respectively. Furthermore, two perpendicular directions are defined accordingly and are referred to as a first direction 116 and a second direction 118. The SRAM cell 110 includes a N-well (region) 120 disposed in the central portion of the cell. The SRAM cell 110 further includes a P-well (region) 122 disposed on the both sides of the N-well 120. In one embodiment, the N-Well 120 and P-well 122 are extended to multiple cells beyond the unit cell boundary.

Various fin active regions are defined in the substrate by isolation features and are isolated from each other by the isolation features. The isolation features are formed in the substrate with a proper technology. For example, the isolation features are utilized by a shallow trench isolation (STI). In one embodiment, the SRAM cell 110 includes a first active region 126 and a second active region 130 formed in the P-well 122. The SRAM cell 110 further includes a third active region 132 and a fourth active region 134 formed in the N-well 120. The first to fourth active regions are disposed along the second dimension and may be extended to multiple cells. In one embodiment, the first and the second active regions are extended to 4 or more cells in the second direction 118. In the present embodiment, each active region in the P-well 122 includes a pull-down device and a pass-gate device.

In one embodiment, the first active region 126 includes the first pull-down device (PD-1) and the first pass-gate device (PG-1) that are cascaded. The source of PG-1 is electrically connected to the drain of the PD-1. Particularly, PD-1 is disposed in a first portion of the first active region 126 while PG-1 is disposed in a second portion of the first active region 126. Similarly, the second active region 130 includes the second pull-down device (PD-2) and the second pass-gate device (PG-2) that are cascaded. The source of PG-2 is electrically connected to the drain of the PD-2. Particularly, PG-2 is disposed in a first portion of the second active region 130 while PD-2 is disposed in a second portion of the second active region 130. The third active region 132 includes the first pull-up device (PU-1) and the fourth active region 134 includes the second pull-up device (PU-2).

Various gate features are formed within the SRAM cell 110 for various nFinFETs and pFinFETs. In one embodiment, the cell 110 includes a first gate feature 136 disposed in the cell region 112 and extended in the first direction over the first active region 126 and the third active region 132, forming the gates for PD-1 and PU-1. The cell 110 includes a second gate feature 138 disposed in the cell region 112 and extended in the first direction over the second active region 130 and the fourth active region 134, forming the gates for PD-2 and PU-2. The cell 110 includes other gate features for the pass-gate devices. In one embodiment, the cell 110 includes a gate feature 140 disposed over the first active region 126, forming the gate for PG-1. The cell 110 also includes a gate feature 144 disposed over the second active region 130, forming the gate for PG-2.

Figure 2:
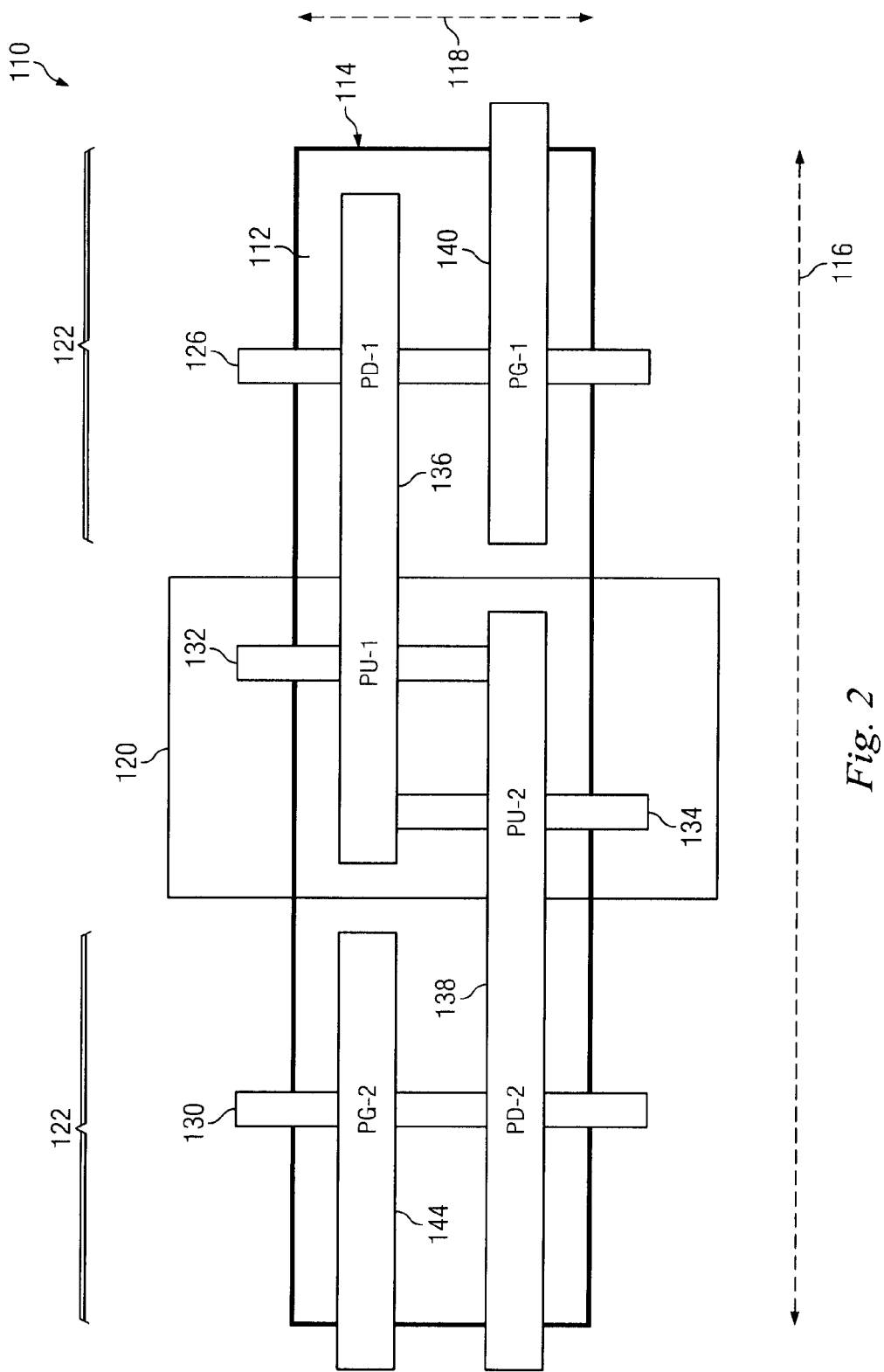
FIGS. 2 to 6 are top views of a SRAM device constructed according to various aspects of the present disclosure in one embodiment.

In one embodiment of the configuration as illustrated in FIG. 2, the first and the second active regions in the P-well 122 and the associated pull-down devices and pass-gate devices are symmetrically disposed on the two sides of the N-well 120. The pull-down devices and pass-gate devices are tuned to have different threshold voltages to address the issues, such as current crowding issue, discussed in the background. The pull-down devices (PD-1 and PD-2) are designed to have a first threshold voltage Vt1. The pass-gate devices (PG-1 and PG-2) are designed to have a second threshold voltage Vt2 different from the first threshold voltage Vt1. Particularly, the second threshold voltage Vt2 is greater than the first threshold voltage Vt1.

Figure 3:
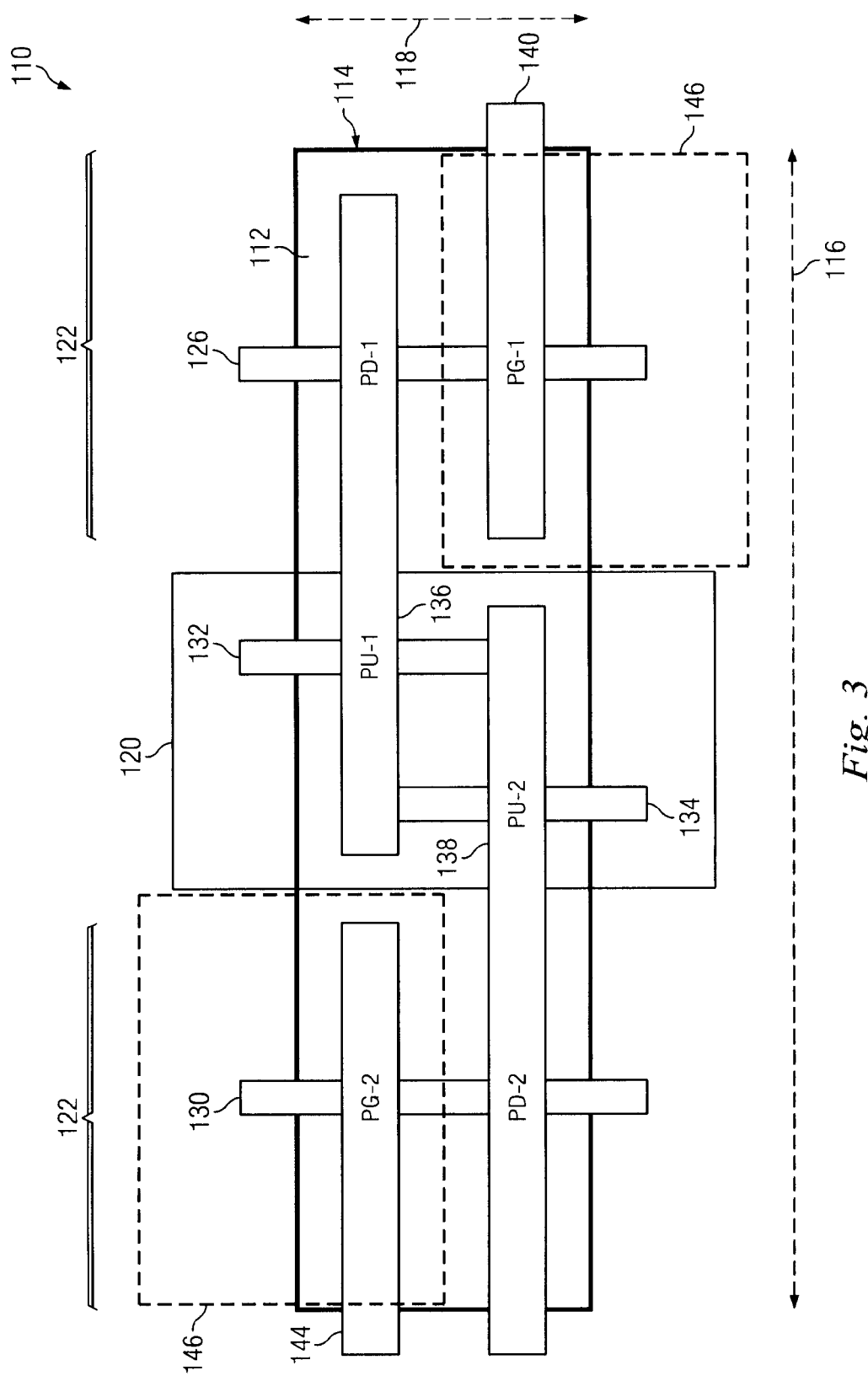

In the present embodiment, The threshold voltages Vt1 and Vt2 are tuned by applying different threshold voltage related implantations to the pull-down devices and pass-gate devices, respectively. With further reference to FIG. 3, illustrated is a top view of the SRAM cell 110 including a doping region 146 that defines an area where an additional threshold voltage related doping process is applied to. The doping region 146 includes the pass-gate devices PG-1 and PG-2. During the additional threshold voltage related doping process, this additional doping process is only applied to the pass-gate devices while the other areas including pull-down devices and pull-up devices are protected from this additional doping process. For example, a lithography process is implemented to form, on the semiconductor substrate, a patterned photoresist layer having openings defining the doping region 146. The additional threshold voltage related doping process is then applied to the semiconductor substrate such that only the pass-gate devices are doped to tune the corresponding threshold voltage. In an alternative embodiment, a hard mask layer may be used to define the doping region 146. In this case, a hard mask layer is first formed on the semiconductor substrate. A patterned photoresist layer is then formed on the hard mask layer by a lithography process. The patterned photoresist layer includes openings defining the doping region 146. An etch process is applied to the hard mask layer to transfer the openings of the patterned photoresist layer to the hard mask layer. The patterned photoresist layer is removed by ashing or wet stripping. The additional doping process is then applied to the semiconductor substrate within the doping region 146, tuning the threshold voltage of the pass-gate devices. The additional doping process can be implemented using an ion implantation. The additional doping process includes p-type dopant, such as boron (B11), boron fluoride (BF2) or indium (In).

In one embodiment, the additional doping process is a channel doping process applied to the doping region 146 and is designed to tune the threshold voltage of the pass-gate devices. The channel doping process is performed before the formation of gate stacks so that the doped species can distributed in the channel region. First, a channel doping process with a p-type dopant is applied to nFinFETs in the SRAM cell 110, including both the pull-down devices and the pass-gate devices to adjust the threshold voltages of the pull-down devices and pass-gate devices. Then the additional doping process with a p-type dopant is applied to the semiconductor substrate within the doping region 146 to further tune the threshold voltage of the pass-gate devices. Thus, the threshold voltage of the pass-gate devices is greater than the threshold voltage of the pull-down devices. In one embodiment, the additional doping process in this sequence includes a p-type dopant, such as B11, BF2, Indium or a combination thereof. In another embodiment, the additional doping process includes a doping dosage ranging from about $10^{12}/cm^2$ to about $5\times10^{13}/cm^2$. In another embodiment, the implant angle of the additional doping process ranges between 0 and about 30 degree. In one embodiment with B11 as the doping species, the additional doping process includes an implant energy ranging between about 1 kev and about 20 kev. In another embodiment with BF2 or indium as the doping species, the additional doping process includes an implant energy ranging between about 10 kev and about 70 kev.

In an alternative embodiment for channel doping to the nFinFETs in the SRAM cell 110, a first channel doping process with a first doping dosage is applied to the pull-down devices while the pass-gate devices and pull-up devices are protected from the first doping process using a patterned photoresist layer or a patterned hard mask layer. A second channel doping process with a second doping dosage is applied to the pass-gate devices while the pull-down devices and pull-up devices are protected from the second doping process using a patterned photoresist layer or a patterned hard mask layer defining the doping region 146. The second doping dosage is greater than the first doping dosage. The result is the threshold voltage of the pass-gate devices being greater than that of the pull-down devices. In one example, the second doping dosage is greater than the first doping dosage by an amount ranging between about $10^{12}/cm^2$ and about $5\times10^{13}/cm^2$.

In another embodiment, the additional doping process is a pocket implantation process applied to the doping region 146 and is designed to tune the threshold voltage of the pass-gate devices. The pocket implantation process is performed after the formation of gate stacks so that the doped species are distributed at the edges of the channel region.

First, a pocket implantation process with a p-type dopant is applied to nFinFETs in the SRAM cell 110, including both the pull-down devices and the pass-gate devices to adjust the corresponding threshold voltages of the pull-down devices and pass-gate devices. Then the additional pocket implantation process with a p-type dopant is applied to the semiconductor substrate within the doping region 146 to further tune the threshold voltage of the pass-gate devices. Thus, the threshold voltage of the pass-gate devices is greater than the threshold voltage of the pull-down devices.

In one embodiment, the additional pocket implantation process in this sequence includes a p-type dopant, such as B11, BF2, Indium or a combination thereof. In yet another embodiment, the additional pocket implantation process includes a doping dosage ranging from about $10^{12}/cm^2$ to about $5\times10^{13}/cm^2$. In another embodiment, the implant angle of the additional pocket implantation process ranges between about 10 degree and about 450 degree. In yet one embodiment with B11 as the doping species, the additional pocket implantation process includes an implant energy ranging between about 1 kev and about 20 kev. In yet another embodiment with BF2 or indium as the doping species, the additional pocket implantation process includes an implant energy ranging between about 10 kev and about 70 kev.

In an alternative embodiment for pocket implantation to the nFinFETs in the SRAM cell 110, a first pocket implantation process with a first doping dosage is applied to the pull-down devices while the pass-gate devices and pull-up devices are protected from the first doping process using a patterned photoresist layer or a patterned hard mask layer. A second pocket implantation process with a second doping dosage is applied to the pass-gate devices while the pull-down devices and pull-up devices are protected from the second doping process using a patterned photoresist layer or a patterned hard mask layer defining the doping region 146.

By performing the additional doping process (channel doping or pocket implant) only to the pass-gate devices while other nFinFETs (e.g., PD-1 and PD-2) are covered from the additional doping process, the pass-gate devices include a p-type doping profile with a doping concentration higher than that of the pull-down devices in the channel (by channel doping) or at the channel edges (by pocket implant), such that the pass-gate devices are tuned to have a threshold voltage greater than that of the pull-down devices.

One or more advantages are present in various embodiments of the present SRAM cell 110 and the method making the same. A beta ratio is defined as a ratio between the channel electrical current of the pull-down devices I_pd to the channel electrical current of the pass-gate devices I_pg. In this case, the beta ratio I_pd/I_pg is greater than 1. Especially, the present structure and method provide a way to tune the beta ratio for a single port SRAM cell formed with FinFETs in which other options are very limited. In another example, the disclosed SRAM cell is a lithography-friendly cell layout so that the method can be implemented without additional manufacturing issues, in consideration that the all gate electrodes have the same pitch in a unit cell array.

Another parameter "drawn beta ratio" is defined as the (PD_width*PG_length)/(PG_width*PD_length) where "PD_width" is the channel width of the pull-down devices, "PG_length" is the channel length of the pass-gate devices, "PG_width" is the channel width of the pass-gate devices, and "PD_length" is the channel length of the pull-down devices.

In another embodiment, by performing the additional doping process (channel doping or pocket implant) only to the pass-gate devices while other nFinFETs (e.g., PD-1 and PD-2) are covered from the doping, the beta ratio can be increased by an amount from about 0.1 to about 1. The method is an effective way to tune the beta ratio for a SRAM cell having a drawn beta ratio equal to 1 or less than 1.

Figure 4:
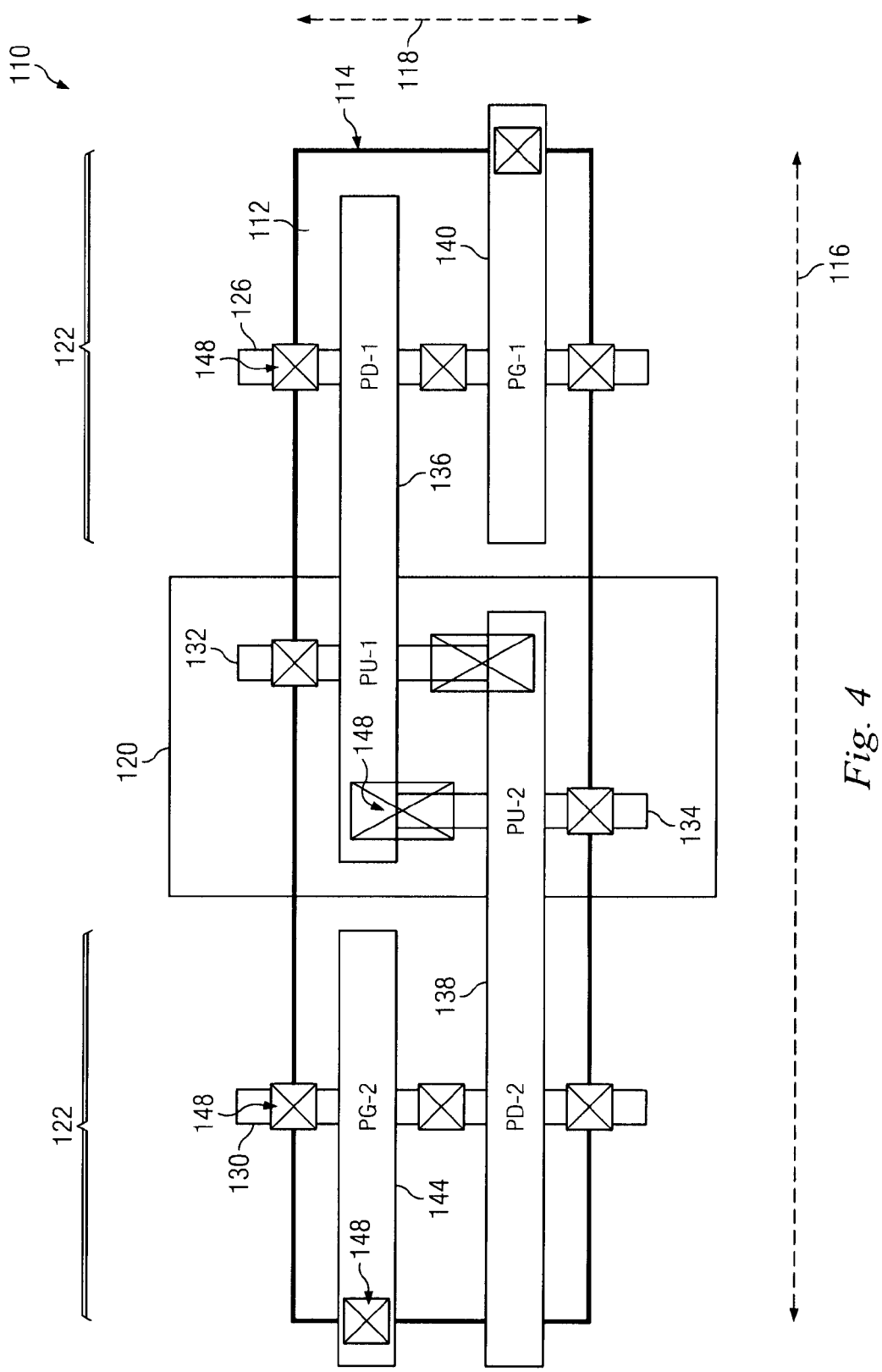

With further reference to FIG. 4, illustrated is a top view of the SRAM cell 110 including interconnect routings. Various interconnect structures may be utilized to couple the nFinFETs and pFinFETs to form the functional SRAM cell. In one embodiment, the drain of PD-1 is electrically connected to the source of PG-1 by sharing a common doped region, a region defined in the first active region 126 and positioned between the PD-1 and PG-1.

In another embodiment, the drain of PD-1 is electrically connected to the source of PG-1 by a silicide feature (not shown) formed on the common doped region within the first active region 124. The silicide feature is formed by a process known in the art such as self-aligned silicide (salicide) and can be formed together with other contact silicide in a same processing procedure. In another embodiment, a contact is designed to land on both the drain of PD-1 and the source of PG-1. In yet another embodiment, the drain of PD-1 and the source of PG-1 share a common region. Similarly, the drain of PD-2 and the source of PG-2 are electrically connected in a way similar to the connection between the drain of PD-1 and the source of PG-1, such as by a silicide feature.

The drains (drain node) of PD-1 and PU-1 are electrically connected using a first interconnect feature, defining a first data node (node 1 or data node). Similarly, the drains (drain node) of PD-2 and PU-2 are electrically connected using a second interconnect feature, defining a second data node (node 2 or data node bar). The first interconnect feature and the second interconnect feature are formed in a same interconnect layer (referred to as first interconnect layer) by a same processing procedure. The first and second interconnect features may be a silicide feature.

Various contacts 148 (marked as a square with an "X") are formed on gates, drain nodes, and various landing pads. The various contacts are designed as a square or rectangle in a top view. For example, a contact is designed as a rectangle oriented in the second direction 118 such that the contact lands on both the first gate feature 136 and the drain of the PU-2. Similarly, another contact is designed as a rectangle oriented in the second direction 118 such that the contact lands on both the second gate feature 138 and the drain of the PU-1.

Figure 5:
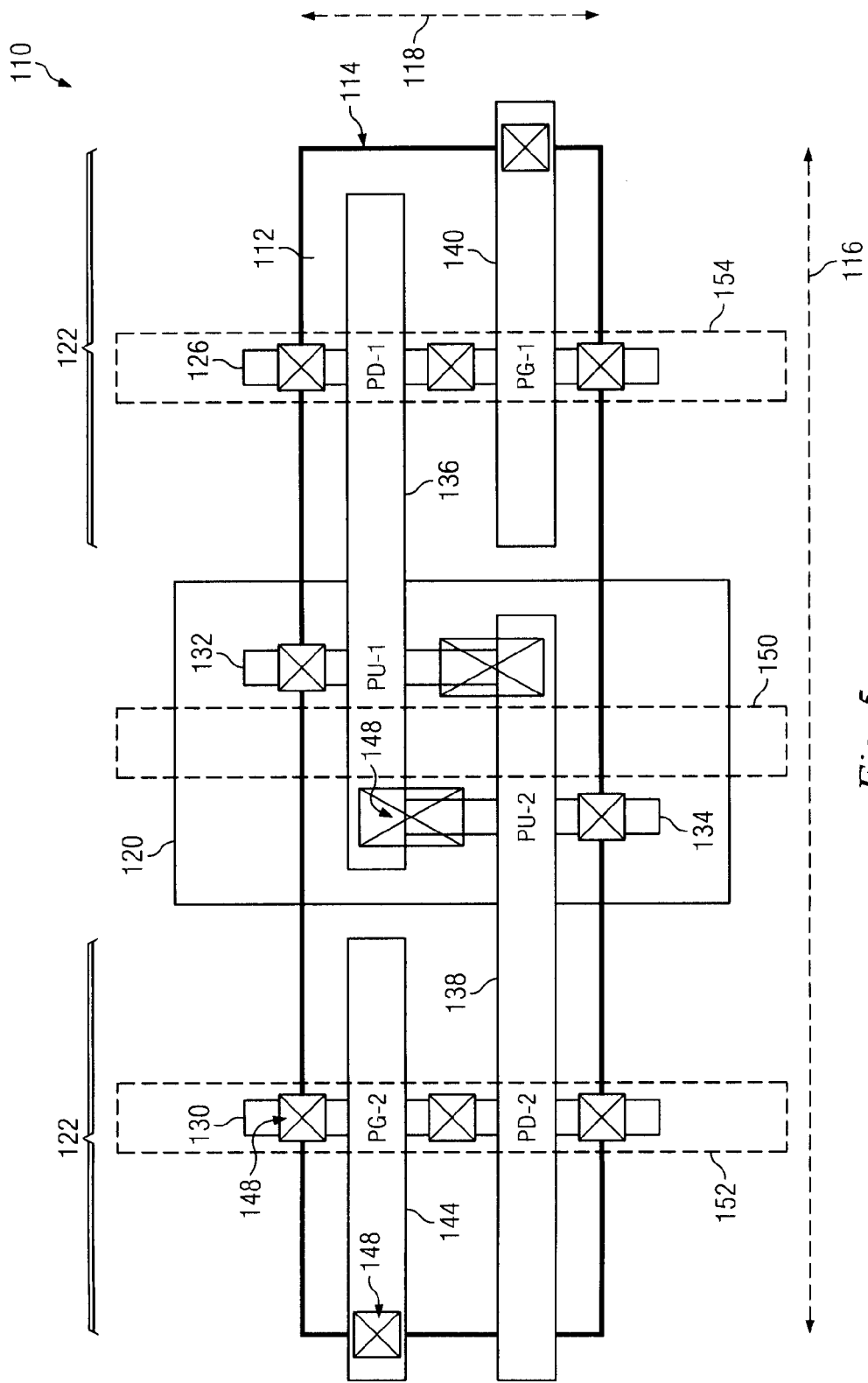
Figure 6:
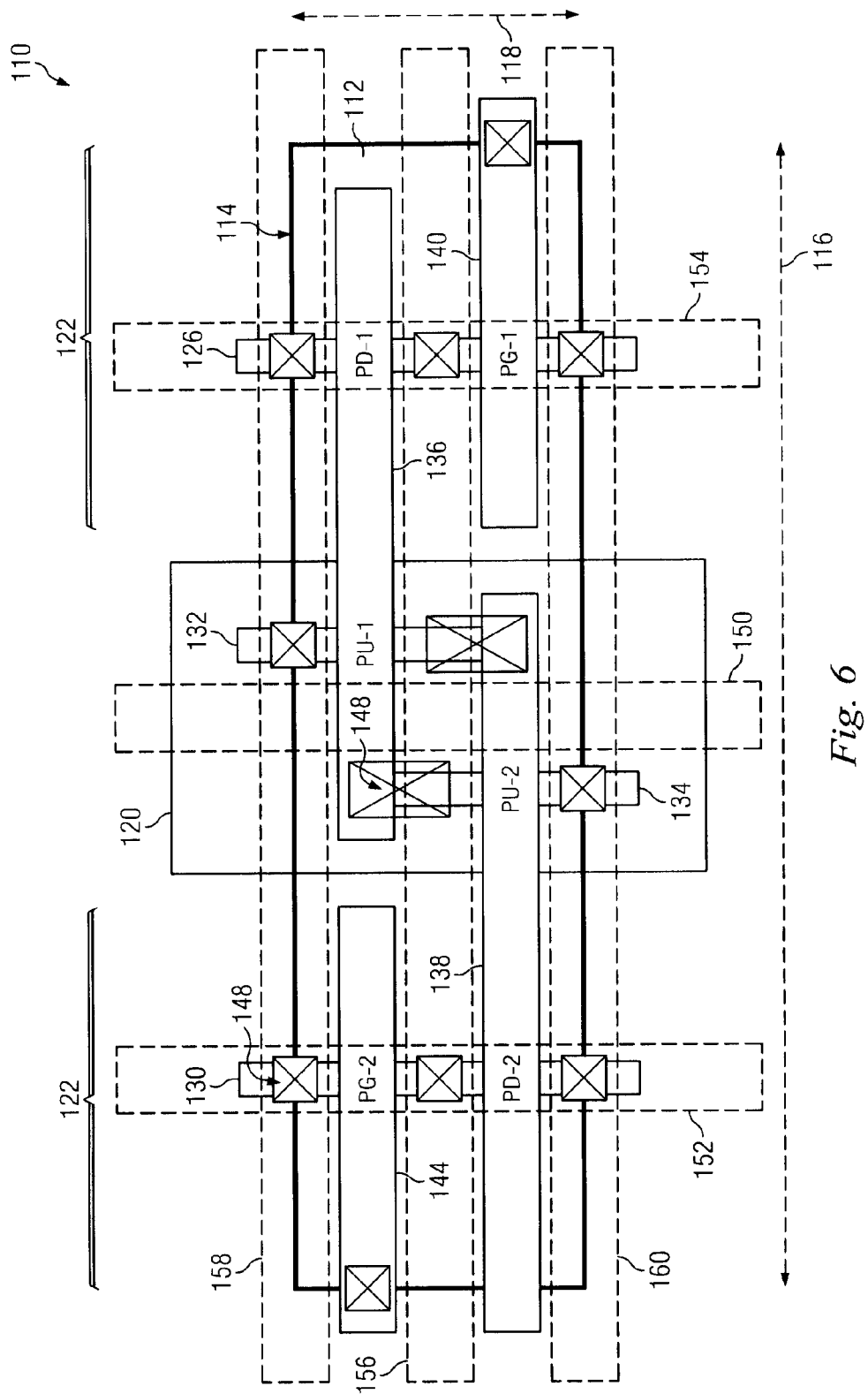

FIGS. 5 and 6 are top views of the SRAM cell 110 constructed according to various aspects of the present disclosure in another embodiment. More particularly, various interconnect features are formed in the SRAM cell 110. In one embodiment, the SRAM cell 110 includes various interconnect features, such as metal lines 150, 152 and 154, oriented in the second direction 118 and formed in a same metal layer as illustrated in FIG. 5. In one example, the metal line 150 is a power line for Vcc coupled to the source of the pull-up devices, the metal line 152 is a bit line coupled to the drain of PU-2, and the metal line 154 is a bit line coupled to the drain of PU-1. The metal lines 150, 152 and 154 in this metal layer are coupled to the corresponding landing features through corresponding contacts 148.

In another embodiment, the SRAM cell 110 includes various interconnect features, such as metal lines 156, 158 and 160, oriented in the first direction 116 and formed in a same metal layer as illustrated in FIG. 6. In one example, the metal line 156 is a word line coupled to the gates of the pass-gate devices, the metal line 158 is a complimentary power line Vss coupled to the source of PD-1, and the metal line 160 is another complimentary power line Vss coupled to the source of PD-2. In one embodiment, the metal lines 156, 158 and 160 are disposed over the metal lines 150, 152 and 154.

Figure 7:
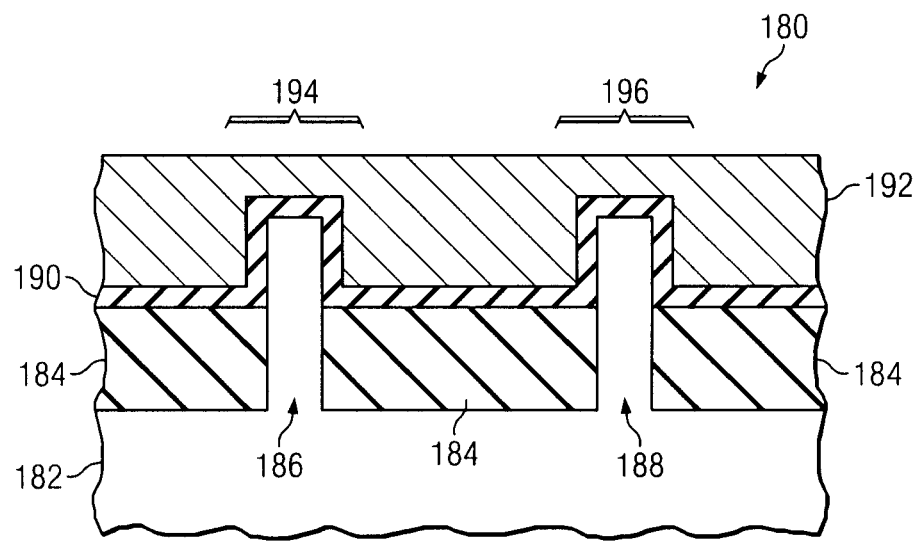
FIGS. 7 to 8 are sectional views of a portion of a SRAM device constructed according to various aspects of the present disclosure in various embodiments.

FIG. 7 is a sectional view of a semiconductor structure 180 as a portion of a SRAM cell, such as the SRAM cell 100 of FIG. 1 or the SRAM cell 110 of FIG. 2. The semiconductor structure 180 includes a semiconductor substrate 182. The semiconductor substrate 182 includes silicon. Alternatively, the substrate includes germanium, silicon germanium or other proper semiconductor materials. The semiconductor substrate 182 includes various isolation features 184, such as shallow trench isolation (STI), are formed in the substrate to separate various devices. The semiconductor substrate also includes various doped regions such as n-well and p-wells. The semiconductor structure 180 includes various fin active regions 186 and 188. The fin active regions and the STI features can be formed in a processing sequence including forming trenches in the semiconductor substrate 182 and partially filling the trenches with a dielectric material. Alternatively, the trenches are completely filled with the dielectric material. Then a polishing process, such as chemical mechanical polishing (CMP) process is applied to remove the excessive dielectric material and planarize the surface. Thereafter, the formed STI features are partially removed to form the fin active regions using a selective etch such as hydrochloride (HF) wet etch. Particularly, the processing sequence includes etching trenches in the semiconductor substrate 182 and filling the trenches by one or more dielectric materials such as silicon oxide, silicon nitride, silicon oxynitride or combinations thereof. The filled trench may have a multi-layer structure such as a thermal oxide liner layer with silicon nitride filling the trench. In furtherance of the present embodiment, the STI features are created using a process sequence such as: growing a pad oxide, forming a low pressure chemical vapor deposition (LPCVD) nitride layer, patterning an STI opening using photoresist and masking, etching a trench in the substrate, optionally growing a thermal oxide trench liner to improve the trench interface, filling the trench with CVD oxide, using chemical mechanical planarization (CMP) to etch back, and using nitride stripping to leave the STI structure. The semiconductor substrate 182 also includes various n-wells and p-wells formed in various fin active regions.

Various gates are further formed on the fin active regions. A gate feature includes a gate dielectric layer 190 (such as silicon oxide) and a gate electrode 192 (such as doped polysilicon) disposed on the gate dielectric layer 190. In another embodiment, the gate feature alternatively or additionally includes other proper materials for circuit performance and manufacturing integration. For example, the gate dielectric layer includes high k dielectric material layer. The gate electrode includes metal, such as aluminum, copper, tungsten or other proper conductive material. In yet another embodiment, the gate electrode includes a metal having proper work function to the associated FinFET. For a gate stack including high-k dielectric material and metal, the gate can be formed by a gate-last process or a high-k-last process (a complete gate-last process).

In the present embodiment for illustration, the semiconductor substrate 180 includes a first region 194 for one or more FinFETs and a second region 196 for one or more FinFETs. In one example, the active region 186 is the third active region 132 in the n-well 120 of FIG. 2 and the active region 188 is the first active region 126 in the p-well 122 of FIG. 2.

Figure 8:
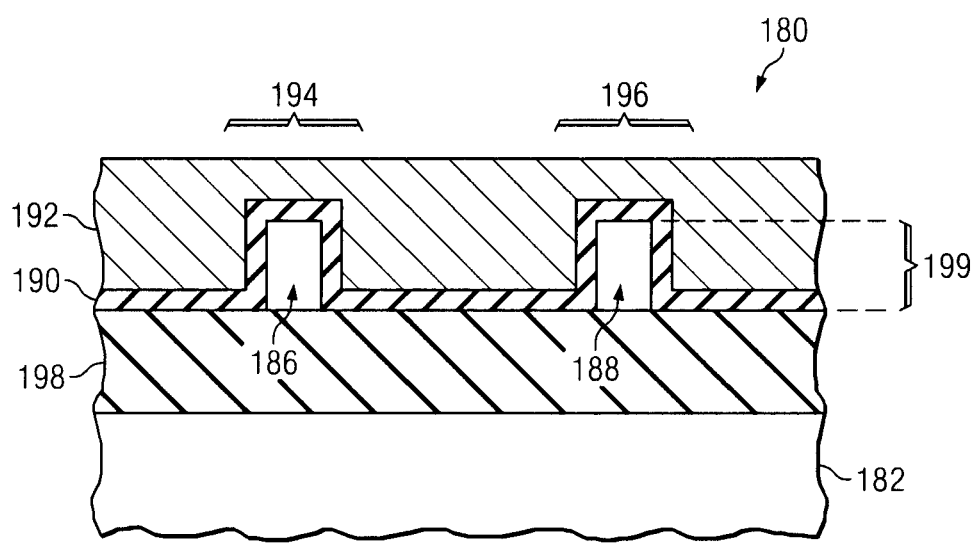

FIG. 8 is another embodiment of a sectional view of the semiconductor structure 180 as a portion of a SRAM cell, such as the SRAM cell 100 of FIG. 1 or the SRAM cell 110 of FIG. 2. The semiconductor structure 180 includes a semiconductor substrate 182. The semiconductor substrate 182 includes silicon. Alternatively, the substrate includes germanium, silicon germanium or other proper semiconductor materials. The semiconductor substrate 182 includes a dielectric layer 198 formed on the semiconductor substrate 182 for isolation. In one example, the dielectric layer 198 includes silicon oxide. The semiconductor structure 180 includes another semiconductor layer 199, such as silicon, on the dielectric layer 198, referred to as semiconductor on insulator (SOI). The SOI structure can be formed by a proper technology, such as separation by implanted oxygen (SIMOX) or wafer bonding to include the dielectric layer inside semiconductor material.

The semiconductor layer 199 is patterned to form fin active regions 186 and 188. The fin active regions (186 and 188) and the STI features can be formed in a processing sequence including forming a patterned mask layer on the semiconductor layer and etching the semiconductor layer 199 through the openings of the patterned mask layer. The patterned mask layer can be a patterned photoresist layer or a patterned hard mask layer, such as a patterned silicon nitride layer.

Various gates are further formed on the fin active regions. A gate feature includes a gate dielectric layer 190 (such as silicon oxide) and a gate electrode 192 (such as doped polysilicon) disposed on the gate dielectric layer 190. In one embodiment, the gate dielectric layer includes high-k dielectric material layer. The gate electrode includes metal, such as aluminum, copper, tungsten, or other proper conductive material. In the present embodiment for illustration, the semiconductor structure 180 includes a first region 194 for one or more FinFETs and a second region 196 for one or more FinFETs. In one example, the active region 186 is the active region 132 in the n-well 120 of FIG. 2 and the active region 188 is the first active region 126 in the p-well 122 of FIG. 2.

In one embodiment, the processing flow to form a SRAM cell, including the pass-gate and pull-down devices, includes the following steps: formation of fin active regions, well formation, channel dopant formation, additional channel doping process only to pass-gate devices, gate formation, light doped drain (LDD) formation, pocket implant (pocket junction) formation, gate spacer formation, source/drain (S/D) dopant formation, silicide formation, and interconnection formation. In the additional channel doping process, the additional channel dopant is introduced to the channels of the pass-gate devices, increasing the beta ratio of the SRAM cell.

In another embodiment, the processing flow to form a SRAM cell includes the following steps: formation of fin active regions, well formation, channel dopant formation, gate formation, light doped drain (LDD) formation, pocket implant (pocket junction) formation, additional pocket doping process only to pass-gate devices, gate spacer formation, source/drain (S/D) dopant formation, silicide formation, and interconnection formation. In the additional pocket doping process, the additional pocket dopant is introduced to the channel edges of the pass-gate devices, increasing the beta ratio of the SRAM cell. Other embodiments of a SRAM cell and the corresponding method are provided and described below according to various aspects of the present disclosure.

Figure 9:
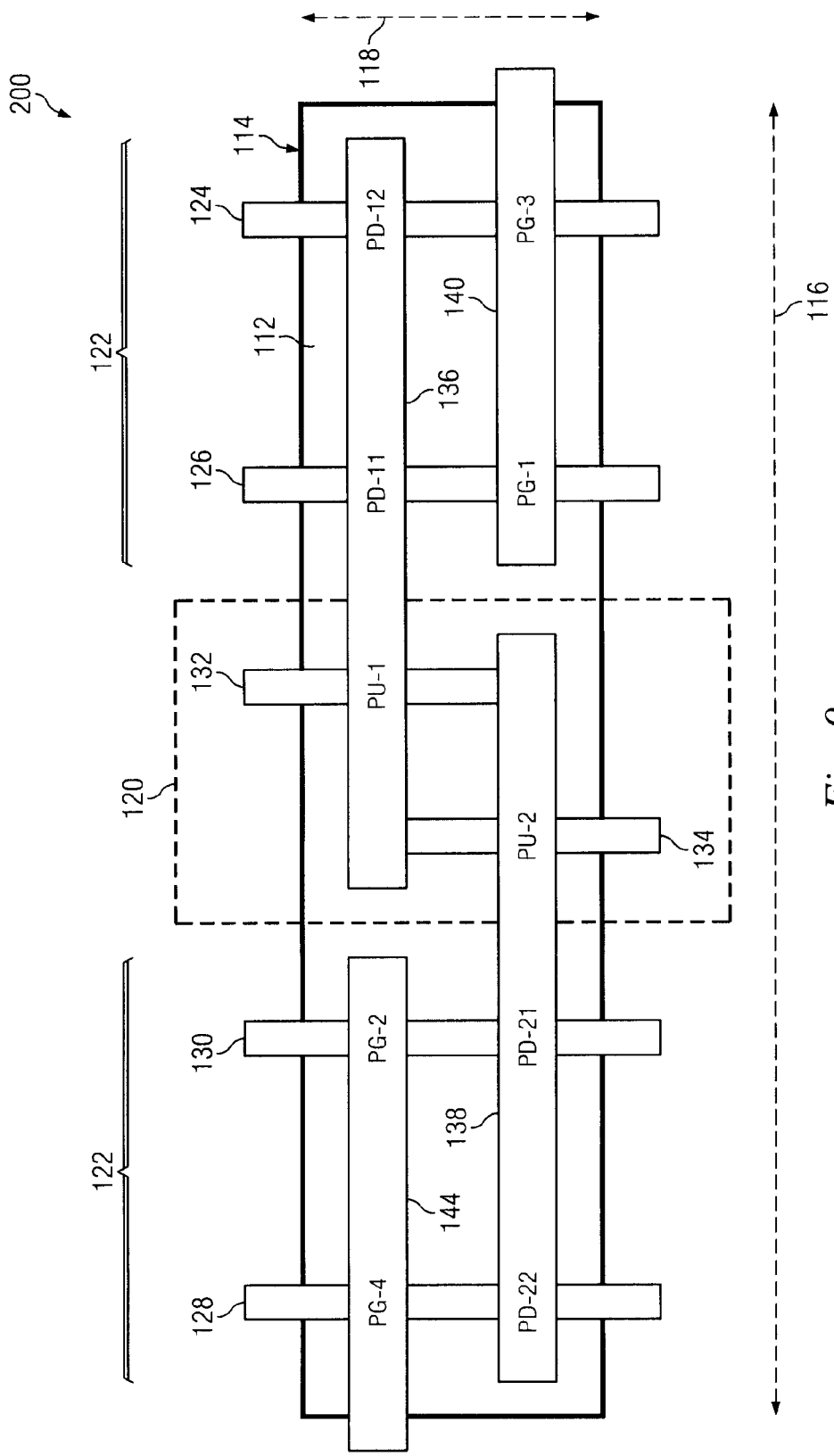
FIGS. 9 to 12 are top views of a SRAM device or a portion thereof constructed according to various aspects of the present disclosure in various embodiments.

FIG. 9 is a top view of a SRAM cell 200 constructed according to various aspects of the present disclosure in one embodiment. In one embodiment, the SRAM cell 200 is similar to the SRAM cell 100 of FIG. 2 except that the SRAM cell 200 includes four pull-down devices and four pass-gate devices. The four pull-down devices are configured in the two cross-coupled inverters and are referred to as PD-11, PD-12, PD-21 and PD-22, respectively. The four pass-gate devices are configured to form a port for data access and are referred to as PG-1, PG-2, PG-3 and PG-4, respectively. In one embodiment, the pull-down devices, pull-up devices and pass-gate devices are formed of finFETs.

Particularly, the first inverter includes two pull-down devices PD-11 and PD-12 configured in parallel. In the parallel configuration, the gates (of PD-11 and PD-12) are electrically connected together, the drains are electrically connected together, and the source are electrically connected together. Similarly, the second inverter includes two pull-down devices PD-21 and PD-22 configured in parallel. The pass-gate devices PG-1 and PG-3 are electrically connected in parallel. The pass-gate devices PG-2 and PG-4 are electrically connected in parallel. The SRAM cell 200 is formed using an additional doping process applied only to the pass-gate devices to tune the beta ratio of the SRAM cell 200. The additional doping process is substantially similar to the additional doping process described with FIG. 3.

For example, the additional doping process is a channel doping process performed before the gate formation. The additional channel doping process introduces additional dopant only to the channels of the pass-gate devices such that the channel doping concentration of the pass-gate devices is greater than that of the pull-down devices. In another example, the additional doping process is a pocket doping process performed after the gate formation. The additional pocket doping process introduces additional dopant only to the channel edges of the pass-gate devices such that the pocket doping concentration of the pass-gate devices is greater than that of the pull-down devices.

The SRAM cell 200 is formed on a semiconductor substrate. The SRAM cell 200 is formed in a unit cell region 112 of the semiconductor substrate. The unit cell region 112 is defined by the unit cell boundary 114. In one embodiment, the unit cell region 112 is defined in a rectangular shape spanning to a first dimension 116 in a first direction and spanning to a second dimension 118 in a second direction perpendicular to the first direction. The first dimension 116 is longer than the second dimension 118. The first and second dimensions (116 and 118) are referred to as a longer pitch and a shorter pitch, respectively. The SRAM cell 200 includes a N-well region 120 disposed in the central portion of the cell. The SRAM cell 200 further includes a P-well region 122 disposed on the both sides of the N-well 120. In one embodiment, the N-Well 120 and P-well 122 are extended to multiple cells beyond the unit cell boundary.

Various fin active regions are defined in the semiconductor substrate by isolation features and are isolated from each other by the isolation features. In one embodiment, the SRAM cell 200 includes a first active region 124, a second active region 126, a third active region 128 and a fourth active region 130 formed in the P-well 122. The SRAM cell 200 further includes a fifth active region 132 and a sixth active region 134 formed in the N-well 120. The first to sixth active regions are disposed along the second dimension and may be extended to multiple cells. In one embodiment, the first to the fourth active regions are extended to 4 or more cells in the second direction 118. In one embodiment, each active region in the P-well includes a pull-down device and a pass-gate device.

In one embodiment, the first active region 124 includes PD-12 and PG-3. The source of PG-3 is electrically connected to the drain of the PD-12. Similarly, the second active region 126 includes PD-11 and PG-1. The source of PG-1 is electrically connected to the drain of the PD-11. The third active region 128 includes PD-22 and PG-4. The source of PG-4 is electrically connected to the drain of PD-22. The fourth active region 130 includes PD-21 and PG-2. The source of PG-2 is electrically connected to the drain of the PD-21. The fifth active region 132 includes the first pull-up device (PU-1) and the sixth active region 134 includes the second pull-up device (PU-2).

Various gate features are formed within the SRAM cell 200 for various nFinFETs and pFinFETs. A gate feature includes a gate dielectric layer (such as silicon oxide or high-k dielectric material) and a gate electrode (such as doped polysilicon or metal) disposed on the gate dielectric layer. In one embodiment, the SRAM cell 200 includes a first gate feature 136 disposed in the cell region 112 and extended in the first direction over the first active region 124, the second active region 126, and the fifth active region 132, forming the gates for PD-11, PD-12 and PU-1. The SRAM cell 110 includes a second gate feature 138 disposed in the cell region 112 and extended in the first direction 116 over the third active region 128, the fourth active region 130, and the sixth active region 134, forming the gates for PD-21, PD-22 and PU-2. The cell 110 includes various gate features for the pass-gate devices. In one embodiment, the SRAM cell 110 includes a gate feature 140 disposed over the first active region 124 and the second active region 126, forming the gate for PG-1 and PG-3. The cell 110 includes a gate feature 144 disposed over the third active region 128 and the fourth active region 130, forming the gate for PG-2 and PG-4.

Figure 10:
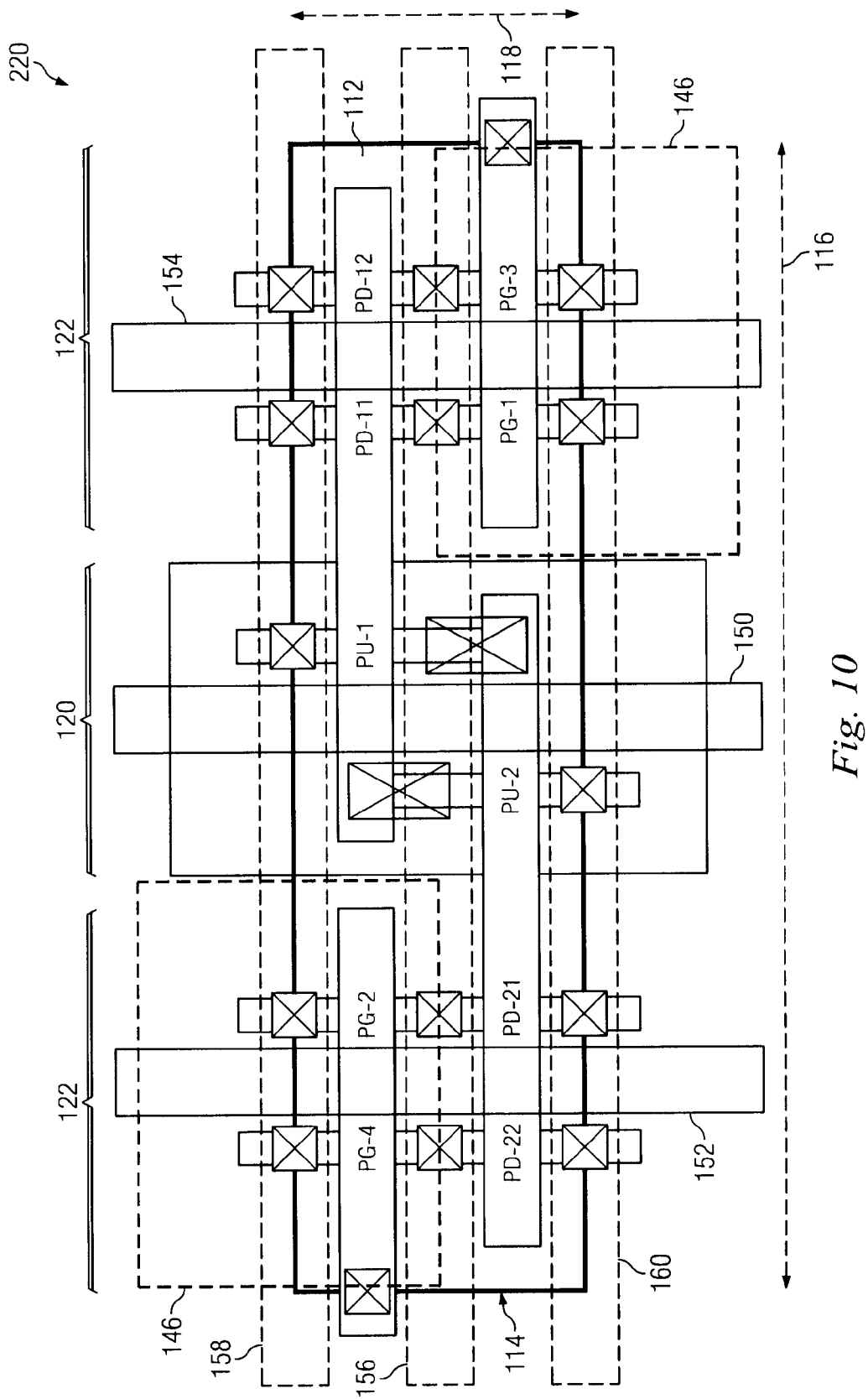

FIG. 10 is a top view of a SRAM cell 220 constructed according to various aspects of the present disclosure in one embodiment. In one embodiment, the SRAM cell 220 is substantially similar to the SRAM cell 200 of FIG. 9. The SRAM cell 220 illustrates a patterned mask layer defining the doping regions 146 for the additional doping process applied only to the pass-gate devices.

The SRAM cell 220 includes various interconnect features, such as contacts and metal lines. Various contacts (marked as a square with an "X") are formed on gates, drain nodes, and various landing pads. The various contacts are designed as a square or rectangle in a top view.

In one embodiment, the SRAM cell 220 includes various interconnect features, such as metal lines 150, 152 and 154, oriented in the second direction 118 and formed in a same metal layer. In one example, the metal line 150 is a power line for Vcc coupled to the source of the pull-up devices, the metal line 152 is a bit line coupled to the drain of PU-2, and the metal line 154 is a bit line coupled to the drain of PU-1. The metal lines 150, 152 and 154 in this metal layer are coupled to the corresponding landing features through corresponding contacts 148.

In another embodiment, the SRAM cell 220 includes various interconnect features, such as metal lines 156, 158 and 160, oriented in the first direction 116 and formed in a same metal layer. In one example, the metal line 156 is a word line coupled to the gates of the pass-gate devices, the metal line 158 is a complimentary power line Vss coupled to the sources of PD-11 and PD-12, and the metal line 160 is another complimentary power line Vss coupled to the sources of PD-21 and PD-22. In one embodiment, the metal lines 156, 158 and 160 are disposed over the metal lines 150, 152 and 154.

Figure 11:
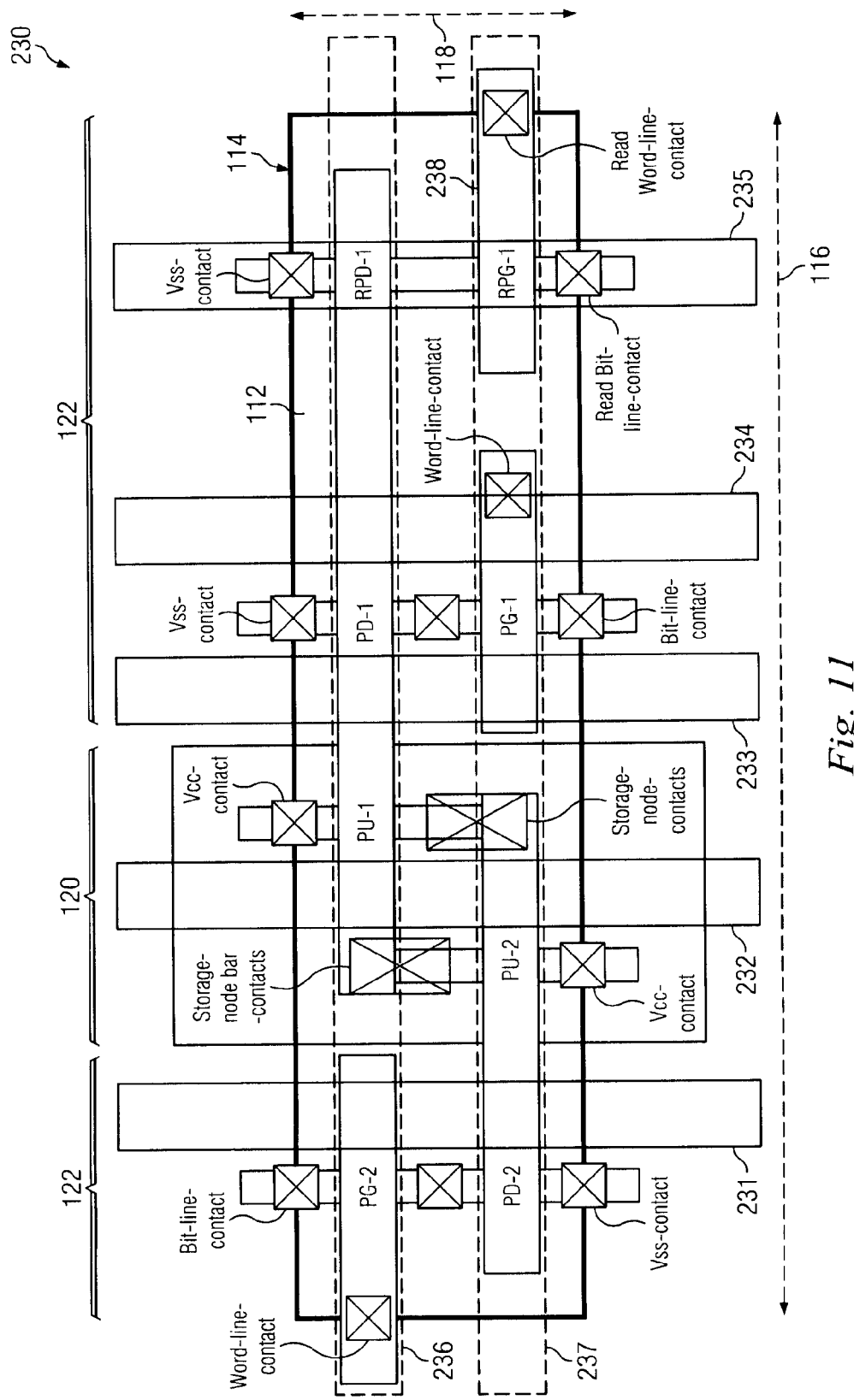

FIG. 11 is another embodiment of a top view of a SRAM device 230. In one embodiment, the SRAM cell 230 is substantially similar to the SRAM cell 110 of FIG. 2 except that the SRAM cell 230 includes an additional read port. The SRAM cell 230 includes a read pull-down device RPD-1 and a read pass-gate device RPG-1 formed of nFinFETs in the p-well 122. The read pull-down device RPD-1 and the read pass-gate device RPG-1 are formed in a continuous fin active region oriented in the second direction 118 as illustrated in FIG. 11. The gate of PD-1 and PU-1 is extended to the RPD-1. The source of RPD-1 is connected to a complimentary power line Vss through a Vss contact. The drain of RPD-1 is connected to the source of RPG-1. Another gate 238 is formed on RPG-1 and is oriented in the first direction 116. The gate 238 is connected to a read word line through a read word-line contact. The drain of RPG-1 is connected to a read bit line through a read bit-line contact. Again, an additional doping process is applied only to various pass-gate devices while other devices are protected from this doping process to increase the beta ratio of the SRAM cell 230.

The SRAM cell 230 includes various interconnect features, such as contacts and metal lines. Various contacts (marked as a square with an "X") are formed on gates, drain nodes, and various landing pads. The various contacts are designed as a square or rectangle in a top view. In one embodiment, these contacts include bit-line contacts, word-line contact, read word-line contact, read bit-line contact, Vss contacts, Vcc contacts, storage node contact and storage node bar contact.

In one embodiment, the SRAM cell 230 includes various interconnect lines, such as 231 to 235, oriented in the second direction 118 and formed in a same metal layer. In one example, the metal line 231 is a bit-line, the metal line 232 is a power line for Vcc coupled to the source of the pull-up devices, the metal line 233 is a bit line coupled to the drain of PG-1, the metal line 254 is a complimentary power line Vss coupled to the source of PD-1, and the metal line 255 is a read bit-line coupled to the drain of RPG-1. The metal lines 150, 152 and 154 in this metal layer are coupled to the respective landing features through corresponding contacts.

In another embodiment, the SRAM cell 230 includes various interconnect lines, such as 236 and 237, oriented in the first direction 116 and formed in a same metal layer. In one example, the metal line 236 is a write word line coupled to the gates of the pass-gate devices, and the metal line 237 is a read word line coupled to the drain of RPG-11. In one embodiment, the metal lines 236 and 237 are disposed over the metal lines 231 through 235.

Figure 12:
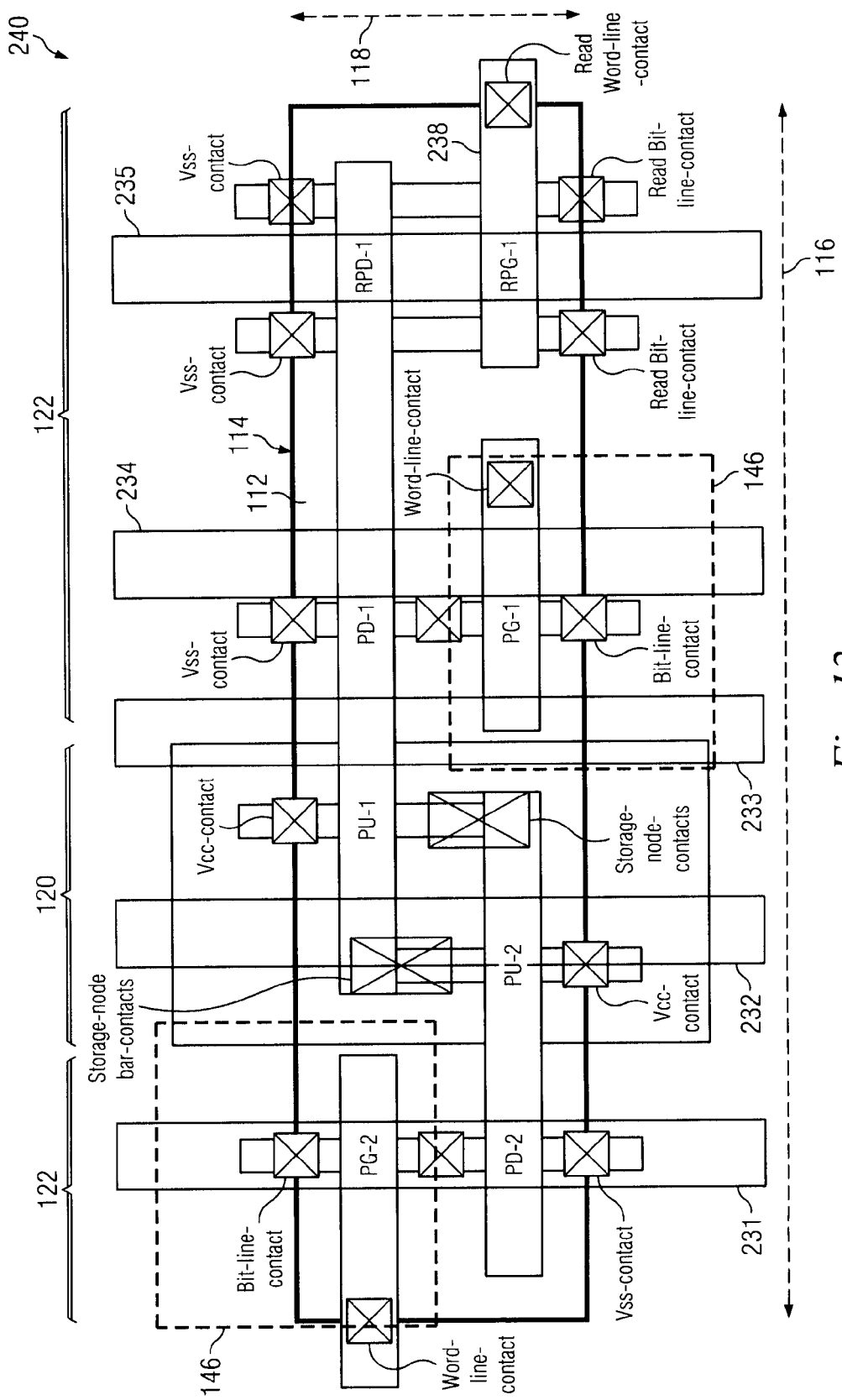

FIG. 12 is another embodiment of a top view of a SRAM device 240. In one embodiment, the SRAM cell 240 is substantially similar to the SRAM cell 230 of FIG. 11 except that the read port of the SRAM cell 240 includes two read pull-down devices RPD-1 and two read pass-gate device RPG-1 formed of nFinFETs in the p-well 122. The two read pull-down devices RPD-1 and the two read pass-gate devices RPG-1 are formed in two continuous fin active regions oriented in the second direction 118 as illustrated in FIG. 12. The gate of PD-1 and PU-1 is extended to the RPD-1. The sources of RPD-1 are connected to a complimentary power line Vss through Vss contacts. The drains of RPD-1 are connected to the sources of RPG-1. Another gate 238 is formed on RPG-1 and is oriented in the first direction 116. The gate 238 is connected to a read word line through a read word-line contact. The drains of RPG-1 are connected to a read bit line through read bit-line contacts. Again, an additional doping process is applied only to various pass-gate devices while other devices are protected from this doping process to increase the beta ratio of the SRAM cell 240. The additional doping process is applied to a doping region 146 including the pass-gate devices PG-1 and PG-2. The doping region 146 is defined to a mask layer using a lithography process.

The SRAM cell 240 includes various interconnect features, such as contacts and metal lines. Various contacts (marked as a square with an "X") are formed on gates, drain nodes, and various landing pads. The various contacts are designed as a square or rectangle in a top view. In one embodiment, these contacts include bit-line contacts, a word-line contact, a read word-line contact, a read bit-line contact, Vss contacts, Vcc contacts, a storage node contact, and a storage node bar contact.

In various embodiments, the disclosed SRAM device addresses the issues noted in the background. In one example, by performing the additional doping process (channel doping or pocket implant) only to the pass-gate devices while other nFinFETs (e.g., PD-1 and PD-2) are covered from the additional doping process, the pass-gate devices include a p-type doping profile with a doping concentration greater than that of the pull-down devices in the channel (by channel doping) or at the channel edges (by pocket implant). The pass-gate devices are tuned to have a threshold voltage greater than that of the pull-down devices. The beta ration of the SRAM cell is thus increased without any change to the SRAM cell layout by adding an additional doping process into the processing flow. In another embodiment, an epitaxy layer may be formed on top of the fin active region. In yet another embodiment, the fin active regions may be strained for improved mobility and performance.

The present disclosure also provides another embodiment of a SRAM cell. The SRAM cell includes first and second pull-up devices. Additionally, the SRAM cell includes first and second pull-down devices configured with the first and second pull-up devices to form two cross-coupled inverters for data storage. Also, the SRAM cell includes first and second pass-gate devices configured with the two cross-coupled inverters to form a port for data access. Furthermore, the first and second pull-down devices each includes a first channel doping feature of a first doping concentration and the first and second pass-gate devices each includes a second channel doping feature of a second doping concentration greater than the first doping concentration. In addition, the first channel doping feature and the second channel doping feature include a p-type dopant selected form the group consisting of indium (In), boron (B), boron fluoride (BF.sub.2), carbon (C), nitrogen (N), or combinations thereof.

The present disclosure also provides another embodiment of a SRAM cell. The SRAM cell includes a first inverter including a first pull-up transistor (PU-1) and a first pull-down transistor (PD-1). Additionally, the SRAM cell includes a second inverter including a second pull-up transistor (PU-2) and a second pull-down transistor (PD-2). The second inverter being cross-coupled with the first inverter for data storage. Also, the SRAM cell includes a port including a first pass-gate transistor (PG-1) and a second pass-gate transistor (PG-2). The port being coupled with the first and second inverters for data access. In addition, each of PD-1, PD-2, PG-1, and PG-2 includes a n-type fin field-effect transistor (nFinFET) and each of PU-1 and PU-2 includes a p-type fin field-effect transistor (pFinFET). Furthermore, PD-1 and PD-2 are designed to have a first threshold voltage and PG-1 and PG-2 are designed to have a second threshold voltage greater than the first threshold voltage. Also, PD-1, PD-2, PG-1, and PG-2 have substantially a same gate length.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A static random access memory (SRAM) cell comprising:
   first and second pull-up devices;
   first and second pull-down devices configured with the first and second pull-up devices to form two cross-coupled inverters for data storage; and
   first and second pass-gate devices configured with the two cross-coupled inverters to form a port for data access, wherein:
      the first and second pull-down devices each includes a first channel doping feature of a first dopant at a first doping concentration,
      the first and second pass-gate devices each includes a second channel doping feature of the first dopant at a second doping concentration greater than the first doping concentration, and
      wherein a total number of pull-down devices in the SRAM cell is greater than a total number of pull-up devices in the SRAM cell; and
   a read port coupled to the two cross-coupled inverters and different than the port, wherein the read port includes first and second read pull-down devices in parallel and first and second read pass-gate devices in parallel, wherein a gate of the first read pull-down device physically contacts a gate of the second read pull-down device, wherein a gate of the first read pass-gate device physically contacts a gate of the second read pass-gate device.

2. The SRAM cell of claim 1, wherein:
   the first doping concentration of the first channel doping feature is tuned such that the pull-down devices have a first threshold voltage; and
   the second doping concentration of the second channel doping feature is tuned such that the pass-gate devices have a second threshold voltage greater than the first threshold voltage.

3. The SRAM cell of claim 1, wherein the pull-up devices, pull-down devices, and pass-gate devices are fin field-effect transistors (FinFETs).

4. The SRAM cell of claim 1, wherein each of the pull-up devices includes a p-type fin field-effect transistor (pFinFET) formed in a n-well region, and each of the pull-down devices and pass-gate devices includes a n-type fin field-effect transistor (nFinFET) formed in a p-well region.

5. The SRAM cell of claim 4, wherein the nFinFET and pFinFET each includes a gate stack having a high-k dielectric material layer and a metal layer disposed on the high-k dielectric material layer.

6. The SRAM cell of claim 1, wherein the first channel doping feature and the second channel doping feature include a p-type dopant selected form the group consisting of indium (In), boron (B), boron fluoride ($BF_2$), carbon (C), nitrogen (N), or combinations thereof.

7. The SRAM cell of claim 1, further comprising a drawn beta equal to or less than 1.

8. The SRAM cell of claim 1, wherein
a drain of the first pass-gate (PG-1) is electrically connected to a first bit-line;
a source of PG-1 is electrically connected to a drain of the first pull-down device (PD-1);
a gate of PG-1 is electrically connected to a word-line;
a drain of the second pass-gate (PG-2) is electrically connected to a bit-line;
a source of PG-2 is electrically connected to a drain of the second pull-down device (PD-2); and
a gate of PG-2 is electrically connected to the word-line.

9. The SRAM cell of claim 8, wherein
a drain of the first pull-up device (PU-1) and the drain of PD-1 are electrically connected together, defining a data node;
gates of PD-1 and PU-1 are electrically connected together and coupled to a data node bar;
a drain of the second pull-up device (PU-2) and the drain of PD-2 are electrically connected together to the data node bar;
gates of PD-2 and PU-2 are electrically connected together and coupled to the data node;
sources of PU-1 and PU-2 are electrically connected to a Vcc-line; and
sources of PD-1 and PD-2 are electrically connected to a Vss-line.

10. A static random access memory (SRAM) cell comprising:
a first inverter including a first pull-up transistor (PU-1) and a first pull-down transistor (PD-1);
a second inverter including a second pull-up transistor (PU-2) and a second pull-down transistor (PD-2), the second inverter being cross-coupled with the first inverter for data storage; and
a port including a first pass-gate transistor (PG-1) and a second pass-gate transistor (PG-2), the port being coupled with the first and second inverters for data access, wherein:
each of PD-1, PD-2, PG-1, and PG-2 includes a n-type fin field-effect transistor (nFinFET), and each of PU-1 and PU-2 includes a p-type fin field-effect transistor (pFinFET),
PD-1 and PD-2 are designed to have a first threshold voltage,
PG-1 and PG-2 are designed to have a second threshold voltage greater than the first threshold voltage, and
wherein a total number of pull-down transistors in the SRAM cell is greater than a total number of pull-up transistors in the SRAM cell,
wherein each of PD-1, PD-2, PG-1, and PG-2 include a doped channel region that includes one of indium (In) and boron (B); and
a read port coupled to the first and second inverters and different than the port, wherein the read port includes first and second read pull-down transistors in parallel and first and second read pass-gate transistors in parallel, wherein a gate of the first read pull-down transistor physically contacts a gate of the second read pull-down transistor, wherein a gate of the first read pass-gate transistor physically contacts a gate of the second read pass-gate transistor.

11. The SRAM cell of claim 10, wherein PD-1, PD-2, PG-1, and PG-2 have substantially a same gate length.

12. The SRAM cell of claim 10, wherein
PD-1, PD-2, PG-1, and PG-2 each includes a first channel doping feature of a first doping concentration; and
PG-1 and PG-2 each includes an additional second channel doping feature of a second doping concentration.

13. The SRAM cell of claim 10, wherein
PD-1, PD-2, PG-1, and PG-2 each includes a first pocket implant feature of a first doping concentration; and
PG-1 and PG-2 each includes an additional second pocket implant feature of a second doping concentration.

14. The method of claim 1, wherein the port is a write port.

* * * * *